United States Patent
Holmes et al.

(10) Patent No.: US 9,103,898 B2
(45) Date of Patent: Aug. 11, 2015

(54) MOTION CORRECTION IN ACCELERATED T1-WEIGHTED MAGNETIC RESONANCE IMAGING

(75) Inventors: James Hartman Holmes, Cambridge, WI (US); Jean Helen Brittain, Middleton, WI (US); Reed Frederick Busse, Waukesha, WI (US); Ajeetkumar Gaddipati, Waukesha, WI (US); Xiaoli Zhao, New Berlin, WI (US); Philip James Beatty, Toronto (CA); Zhiqiang Li, Tempe, AZ (US); Howard Andrew Rowley, Madison, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 613 days.

(21) Appl. No.: 13/450,177

(22) Filed: Apr. 18, 2012

(65) Prior Publication Data

US 2012/0262172 A1  Oct. 18, 2012

Related U.S. Application Data

(60) Provisional application No. 61/476,592, filed on Apr. 18, 2011.

(51) Int. Cl.
*G01R 33/48* (2006.01)
*G01R 33/565* (2006.01)
*G01R 33/56* (2006.01)
*G01R 33/561* (2006.01)

(52) U.S. Cl.
CPC ...... *G01R 33/56509* (2013.01); *G01R 33/5602* (2013.01); *G01R 33/4824* (2013.01); *G01R 33/5611* (2013.01)

(58) Field of Classification Search
CPC ............. G01R 33/56509; G01R 33/5602; G01R 33/5611; G01R 33/4824
USPC ................................................. 324/300–322
See application file for complete search history.

(56) References Cited

U.S. PATENT DOCUMENTS

| | | | |
|---|---|---|---|
| 7,439,739 B2 | 10/2008 | Beatty | |
| 7,619,410 B2 | 11/2009 | Beatty et al. | |
| 2008/0068016 A1* | 3/2008 | Gaddipati et al. | 324/318 |
| 2008/0303521 A1* | 12/2008 | Beatty et al. | 324/312 |
| 2010/0013475 A1* | 1/2010 | Kimura | 324/307 |

OTHER PUBLICATIONS

Rydberg, J.N., "T1-Weighted MR Imaging of the Brain Using a Fast Inversion Recovery Pulse Sequence," ISMRM 1996.
Pipe, J.G., "Motion Correction with Propeller MRI: Application to Head Motion and Free-Breathing Cardiac Imaging," Magnetic Resonance in Medicine 42:963-969 (1999).
Skare, S. et al., "An Auto-Calibrated, Angularly Continuous, Two-Dimensional GRAPPA Kernel for Propeller Trajectories," Magnetic Resonance in Medicine 60:1457-1465 (2008).

* cited by examiner

*Primary Examiner* — Melissa Koval
*Assistant Examiner* — Maxwell A Tibbits
(74) *Attorney, Agent, or Firm* — Fletcher Yoder, P.C.

(57) ABSTRACT

A method includes the acts of acquiring a blade of k-space calibration data; acquiring a set of T1-weighted k-space imaging data, the set of T1-weighted k-space imaging data having blades of undersampled k-space data rotated about a section of k-space. Each blade of undersampled k-space data includes first data points having acquired data and second data points that are missing data. The method also includes generating a set of reconstruction weights for the blades of undersampled k-space data using the blade of k-space calibration data; synthesizing k-space data for at least a portion of the second data points using the set of reconstruction weights; and generating a T1-weighted image using the T1-weighted k-space imaging data and the synthesized k-space data.

12 Claims, 8 Drawing Sheets

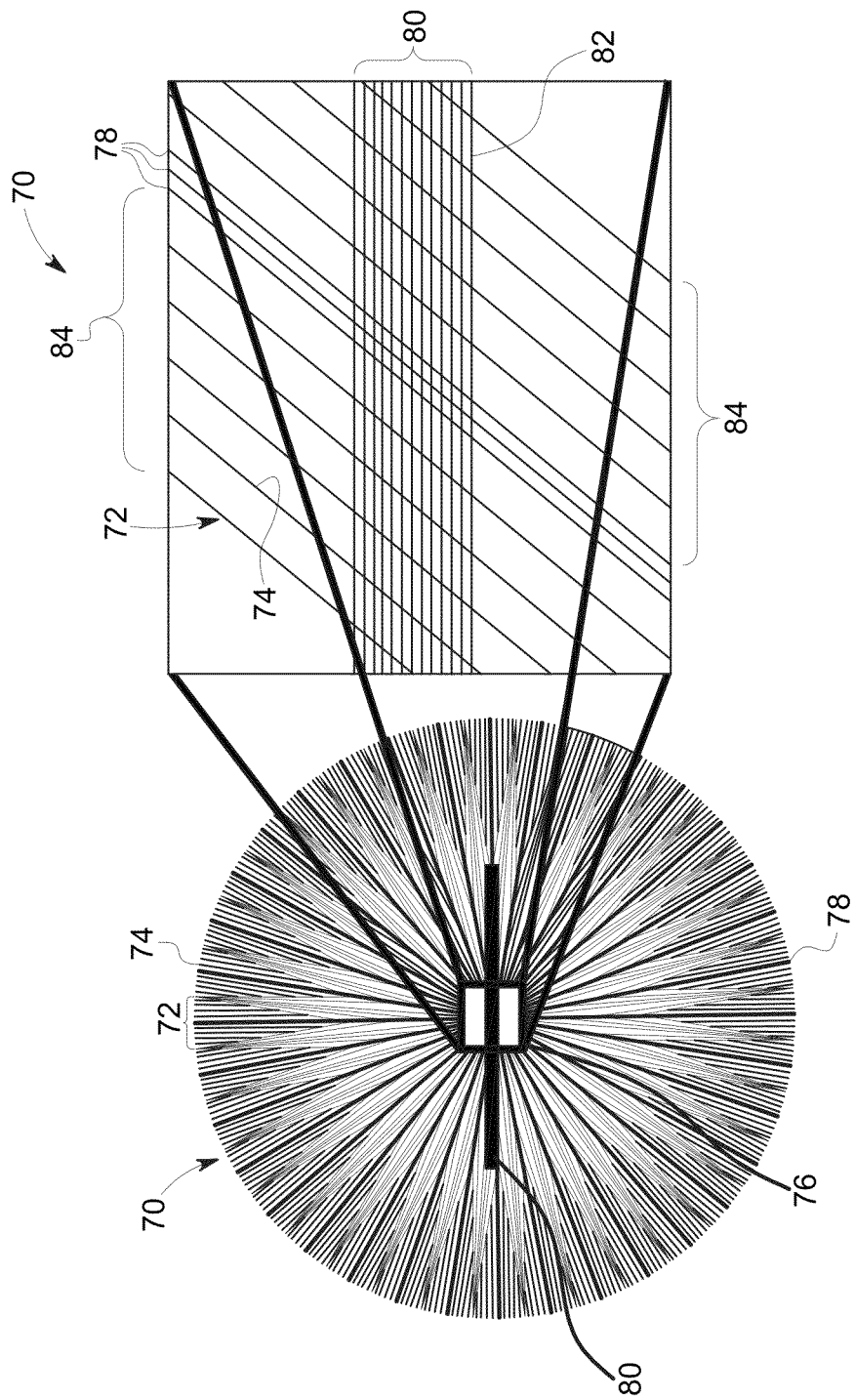

MOTION CORRECTION IN ACCELERATED T1-WEIGHTED MAGNETIC RESONANCE IMAGING

CROSS-REFERENCE TO RELATED APPLICATIONS

This application claims the benefit of U.S. Provisional Patent Application Ser. No. 61/476,592 by Holmes et al., entitled "SYSTEM AND METHOD FOR EXTERNAL CALIBRATION PARALLEL IMAGING FOR IMPROVED MOTION CORRECTION CAPABILITIES WITH T-1 WEIGHTED PROPELLER," filed on Apr. 18, 2011, which is herein incorporated by reference in its entirety.

BACKGROUND

The present embodiments relate to magnetic resonance imaging data collection and processing, and more specifically, to methods for accelerating magnetic resonance data collection and synthesizing motion-corrected images from the collected data.

In general, magnetic resonance imaging (MRI) examinations are based on the interactions among a primary magnetic field, a radiofrequency (RF) magnetic field and time varying magnetic gradient fields with gyromagnetic material having nuclear spins within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

The magnetic fields used to generate images in MRI systems include a highly uniform, static magnetic field that is produced by a primary magnet. A series of gradient fields are produced by a set of gradient coils located around the subject. The gradient fields encode positions of individual plane or volume elements (pixels or voxels) in two or three dimensions. An RF coil is employed to produce an RF magnetic field. This RF magnetic field perturbs the spins of some of the gyromagnetic nuclei from their equilibrium directions, causing the spins to precess around the axis of their equilibrium magnetization. During this precession, RF fields are emitted by the spinning, precessing nuclei and are detected by either the same transmitting RF coil, or by a separate coil. These signals are amplified, filtered, and digitized. The digitized signals are then processed using one or more algorithms to reconstruct a useful image.

Techniques have been developed to perform MRI imaging sequences quickly, so as to avoid long breath holds required of patients, to obtain images of rapidly changing anatomies (e.g., the beating heart), and/or to monitor the flow of one or more fluids (e.g., contrast agents) through various anatomies. Some such techniques acquire less than all of the information normally utilized for image reconstruction, requiring that the absent data be estimated in some way for proper, high quality image creation. However, current techniques for such estimation are often inadequate or subject to further improvement. For example, it can be difficult to obtain clinically useful images using accelerated imaging techniques in situations where the patient being imaged is moving. As an example, during the time in which magnetic resonance (MR) data is obtained, the patient may be moving, which can cause blurring and other artifacts in an image reproduced from the MR data. Indeed, even in situations in which acquisition is accelerated, patient motion may be problematic for image reconstruction. Accordingly, it is now recognized that a need exists for improved methods for data acquisition, estimation, and reconstruction in magnetic resonance imaging techniques that are sensitive to patient motion.

BRIEF DESCRIPTION OF EMBODIMENTS

The present disclosure includes embodiments for improving image data acquisition and processing in such cases. For example, in one embodiment, a magnetic resonance imaging method is provided that includes acquiring a region of k-space calibration data; acquiring a set of T1-weighted k-space imaging data, the set of T1-weighted k-space imaging data having regions of undersampled k-space data rotated about a section of k-space. Each region of undersampled k-space data includes first data points having acquired data and second data points that are missing data. The method also includes generating a set of reconstruction weights for the regions of undersampled k-space data using the region of k-space calibration data; synthesizing k-space data for at least a portion of the second data points using the set of reconstruction weights; and generating a T1-weighted image using the T1-weighted k-space imaging data and the synthesized k-space data.

In another embodiment, a magnetic resonance imaging system is provided. The system includes a primary field magnet configured to place gyromagnetic nuclei within a patient into an equilibrium magnetization; a plurality of gradient field coils configured to encode positional information into the gyromagnetic nuclei; a radiofrequency (RF) transmit coil configured to perturb the gyromagnetic nuclei away from their equilibrium magnetization; a plurality of RF receiving coils configured to receive MR signals from the gyromagnetic nuclei as they relax to their equilibrium magnetization; and control circuitry coupled to the gradient field coils, to the RF transmit coil, and to the plurality of RF receiving coils. The control circuitry is configured to apply control signals to the gradient, RF transmit and receiving coils to: acquire undersampled imaging blades having undersampled T1-weighted k-space data, wherein each undersampled imaging blade is rotated about a section of k-space compared to every other undersampled imaging blade, and each undersampled imaging blade includes first lines having acquired data and second lines in which no data are acquired; and acquire a calibration blade of fully-sampled or over sampled k-space data separately from the imaging blades.

In another embodiment, one or more tangible, non-transitory, machine-readable media are provided storing instructions executable by one or more processors to: cause a magnetic resonance (MR) imaging system to acquire undersampled imaging blades having undersampled T1-weighted k-space data, wherein each undersampled imaging blade is rotated about a section of k-space compared to every other undersampled imaging blade, and each undersampled imaging blade includes first lines having acquired data and second lines in which no data are acquired; cause the MR imaging system to acquire a calibration blade of fully-sampled or oversampled k-space data separately from the imaging blades; generate a set of reconstruction weights for the second lines of the undersampled imaging blades using the calibration blade according to an anti-aliasing partially parallel encoded acquisition reconstruction (APPEAR) algorithm; synthesize k-space data for the second lines using the set of reconstruction weights to generate fully sampled imaging blades; and correct the fully sampled imaging blades, or image data generated from the fully sampled imaging blades, for motion according to a periodically rotated overlapping parallel lines with enhanced reconstruction (PROPELLER) algorithm to generate a motion-corrected T1-weighted image.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIG. 2 is an illustration of an embodiment of a sampling pattern formed by acquiring a calibration blade and a plurality of imaging blades in k-space;

FIG. 3 is an expanded view of one of the imaging blades and the calibration blade of FIG. 2;

DETAILED DESCRIPTION OF EMBODIMENTS

Figure 1:
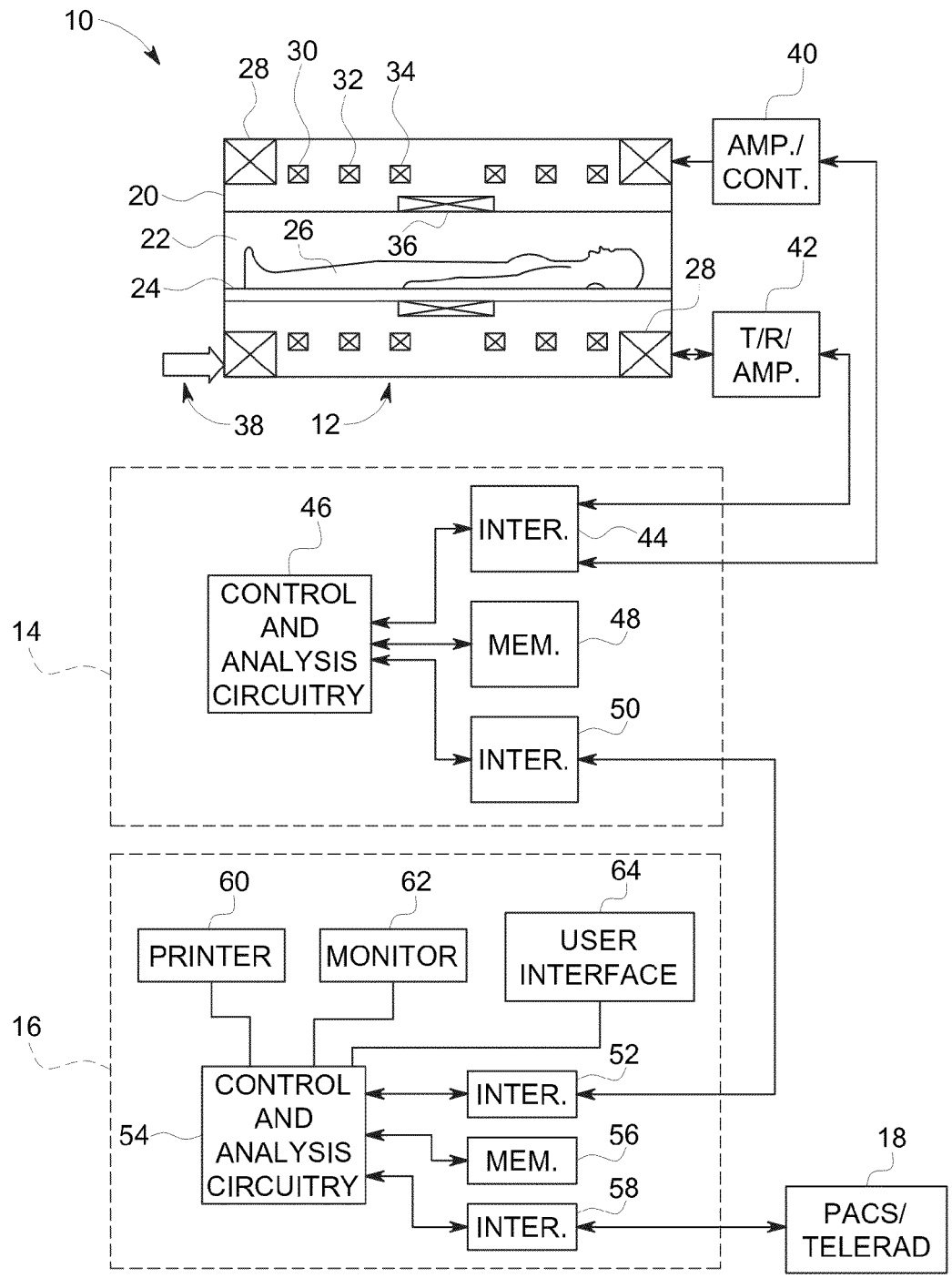
FIG. 1 is a diagrammatic illustration of an embodiment of a magnetic resonance imaging system configured to perform the data acquisition and image reconstruction described herein.

As noted above, it can be difficult to obtain clinically useful images using accelerated imaging techniques in situations where the patient being imaged is moving. In some situations, techniques for motion correction may utilize large areas of k-space acquired within a single repetition time (TR) using a non-Cartesian acquisition. The areas of k-space acquired in separate TR's may be combined to generate a single image after performing a motion-correction algorithm. One such technique is Periodically Rotated Overlapping Parallel Lines with Enhanced Reconstruction (PROPELLER), in which blades of k-space are each acquired in a separate TR, with each blade being rotated about the center of k-space compared to other acquired blades. In accordance with present embodiments, in order for the PROPELLER technique to provide robust motion correction, the blades have a certain width, with the width of each blade being measured as a function of the lines of k-space acquired within a single TR and the lines that are not acquired due to acceleration. During each TR, each echo in an echo train may fill one line of a blade.

The number of echoes that may be acquired during a fast spin echo (FSE) sequence (i.e., the echo train length (ETL)) may be determined based on the duration of the TR for each blade, and also based on the nature of the data collected during the FSE sequence. For example, in embodiments where T1 weighting is desired, a relatively short ETL may be chosen, such as between 1 and 15, due at least partially to the short echo time (TE) used to obtain T1 weighted data. In addition, other techniques involving the attenuation of signals may limit the duration of time during each TR in which desired data may be collected from echoes. For example, during a T1-weighted fluid-attenuated inversion recovery (FLAIR) sequence, the time during which useful echoes are collected may be limited based on the inversion time (TI) of the attenuated material (e.g., cerebrospinal fluid (CSF), water). Accordingly, it is now recognized that for certain techniques such as T1 FLAIR, the ETL may be relatively short compared to an ETL that would typically be desirable for robust motion correction using the PROPELLER technique.

The present embodiments address these and other shortcomings of typical approaches by providing a system and method for performing parallel imaging in non-Cartesian T1-weighted acquisitions in conjunction with a PROPELLER technique for motion correction and an anti-aliasing partially parallel encoded acquisition reconstruction (APPEAR) algorithm. In particular, in accordance with present embodiments, a calibration blade is acquired by fully sampling and, in some embodiments, over sampling an area of k-space. The calibration blade is used for parallel imaging reconstruction after acquiring a series of undersampled T1-weighted imaging blades that are each (one after the other) rotated about a section (e.g., the center) of k-space. The imaging blades include lines in which data has been collected and lines in which substantially no data has been collected. The calibration blade is then used for parallel imaging reconstruction by training the reconstruction (also known as calibrating) using the calibration data. In an embodiment, the anti-aliasing partially parallel encoded acquisition reconstruction (APPEAR) algorithm is one such algorithm for training the reconstruction using non-Cartesian data. Each blade may be accelerated by not acquiring regularly spaced phase encode lines, which enables the generation of blades having a sufficient blade width to enable robust motion correction. The imaging blades may also include between one and three lines of internal calibration data, depending on the desired size of each blade or region and the desired length of the ETL.

The embodiments described herein may be performed by a magnetic resonance imaging (MRI) system, wherein specific imaging routines (e.g., accelerated imaging routines for MRI sequences) are initiated by a user (e.g., a radiologist). Further, the MRI system may perform data acquisition, data construction, and image synthesis. Accordingly, referring to FIG. 1, a magnetic resonance imaging system 10 is illustrated schematically as including a scanner 12, a scanner control circuit 14, and a system control circuitry 16. According to the embodiments described herein, the MRI system 10 is generally configured to perform MR imaging, such as accelerated, non-Cartesian imaging sequences. System 10 additionally includes remote access and storage systems or devices such as picture archiving and communication systems (PACS) 18, or other devices such as teleradiology equipment so that data acquired by the system 10 may be accessed on- or off-site. In this way, acquired data may be acquired, followed by on- or off-site processing and evaluation. While the MRI system 10 may include any suitable scanner or detector, in the illustrated embodiment, the system 10 includes a full body scanner 12 having a housing 20 through which a bore 22 is formed. A table 24 is moveable into the bore 22 to permit a patient 26 to be positioned therein for imaging selected anatomy within the patient.

Scanner 12 includes a series of associated coils for producing a controlled magnetic field and for detecting emissions from gyromagnetic material within the anatomy of the subject being imaged. A primary magnet coil 28 is provided for generating a primary magnetic field generally aligned with the bore 22. A series of gradient coils 30, 32, and 34 permit controlled magnetic gradient fields to be generated during examination sequences. A radio frequency (RF) coil 36 is provided for generating radio frequency pulses for exciting the gyromagnetic material, such as for spin perturbation or slice selection. A separate receiving coil or the same RF coil 36 may receive magnetic resonance signals from the gyromagnetic material during examination sequences. Any receiving coil geometry may be used, such as a body coil, a head coil, or the like.

The various coils of scanner 12 are controlled by external circuitry to generate the desired field and pulses, and to read emissions from the gyromagnetic material in a controlled manner. In the illustrated embodiment, a main power supply 38 is provided for powering the primary field coil 28. Driver circuit 40 is provided for pulsing the gradient field coils 30, 32, and 34. Such a circuit typically includes amplification and control circuitry for supplying current to the coils as defined by digitized pulse sequences output by the scanner control circuit 14. Another control circuit 42 is provided for regulating operation of the RF coil 36. Circuit 42 will typically include a switching device for alternating between the active and passive modes of operation, wherein the RF coils transmits and receives signals, respectively. Circuit 42 also includes amplification circuitry for generating the RF pulses and for processing received magnetic resonance signals.

It should be noted that while the scanner 12 and the control/amplification circuitry described above are illustrated as being coupled by a single line, that many such lines may occur in an actual instantiation. For example, separate lines may be used for control, data communication, and so on. Further, suitable hardware may be disposed along each type of line for the proper handling of the data. Indeed, various filters, digitizers, and processors may be disposed between the scanner and either or both of the scanner and system control circuitry 14, 16. By way of non-limiting example, certain of the control and analysis circuitry described in detail below, although illustrated as a single unit, may include additional hardware such as image reconstruction hardware configured to perform the image reconstruction techniques described herein.

As illustrated, scanner control circuit 14 includes an interface circuit 44 which outputs signals for driving the gradient field coils and the RF coil and for receiving the data representative of the magnetic resonance signals produced in examination sequences. The interface circuit 44 is coupled to a control and analysis circuit 46. The control and analysis circuit 46 executes the commands for driving the circuit 42 and circuit 40 based on defined protocols selected via system control circuit 16. Control and analysis circuit 46 also serves to receive the magnetic resonance signals and performs subsequent processing before transmitting the data to system control circuit 16. Scanner control circuit 14 also includes one or more memory circuits 48 which store configuration parameters, pulse sequence descriptions, examination results, and so forth, during operation. Interface circuit 50 is coupled to the control and analysis circuit 46 for exchanging data between scanner control circuit 14 and system control circuit 16. Such data will typically include selection of specific examination sequences to be performed, configuration parameters of these sequences, and acquired data (e.g., undersampled data) which may be transmitted in raw or processed form from scanner control circuit 14 for subsequent processing, storage, transmission and display. Therefore, in certain embodiments, the control and analysis circuit 46, while illustrated as a single unit, may include one or more hardware devices System control circuit 16 includes an interface circuit 52 which receives data from the scanner control circuit 14 and transmits data and commands back to the scanner control circuit 14. The interface circuit 52 is coupled to a control and analysis circuit 54 which may include a CPU in a multi-purpose or application specific computer or workstation. Control and analysis circuit 54 is coupled to a memory circuit 56 to store programming code for operation of the MRI system 10 and to store the processed image data for later reconstruction, display and transmission. The programming code may execute one or more algorithms capable of performing non-Cartesian accelerated imaging sequences and processing undersampled image data, which will be discussed in detail below. An additional interface circuit 58 may be provided for exchanging image data, configuration parameters, and so forth with external system components such as remote access and storage devices 18. Finally, the system control and analysis circuit 54 may include various peripheral devices for facilitating operator interface and for producing hard copies of the reconstructed images. In the illustrated embodiment, these peripherals include a printer 60, a monitor 62, and user interface 64 including devices such as a keyboard or a mouse.

Scanner 12 and the control and analysis circuit 46 associated therewith produce magnetic fields and radio frequency pulses in a controlled manner to excite and encode specific gyromagnetic material within the patient 26. The scanner 12 and control and analysis circuit 46 also sense the signals emanating from such material and create an image of the material being scanned. In certain embodiments, the scan may be an accelerated scan resulting in an array of undersampled image data sets. It should be noted that the MRI system described is merely intended to be exemplary only, and other system types, such as so-called "open" MRI systems may also be used. Similarly, such systems may be rated by the strength of their primary magnet, and any suitably rated system capable of carrying out the data acquisition and processing described below may be employed.

Specifically, aspects of the present disclosure include methods for accelerating the acquisition of magnetic resonance data and the processing of such data to construct a motion-corrected image. At least a portion of the disclosed methods may be performed by the system 10 described above with respect to FIG. 1. That is, the MRI system 10 may perform the acquisition techniques described herein, and, in some embodiments, the data processing techniques described herein. It should be noted that subsequent to the acquisitions described herein, the system 10 may simply store the acquired data for later access locally and/or remotely, for example in a memory circuit (e.g., memory 56). Thus, when accessed locally and/or remotely, the acquired data may be manipulated by one or more processors contained within an application-specific or general purpose computer. The one or more processors may access the acquired data and execute routines stored on one or more non-transitory, machine readable media collectively storing instructions for performing methods including the image processing and reconstruction methods described herein.

Figure 10:
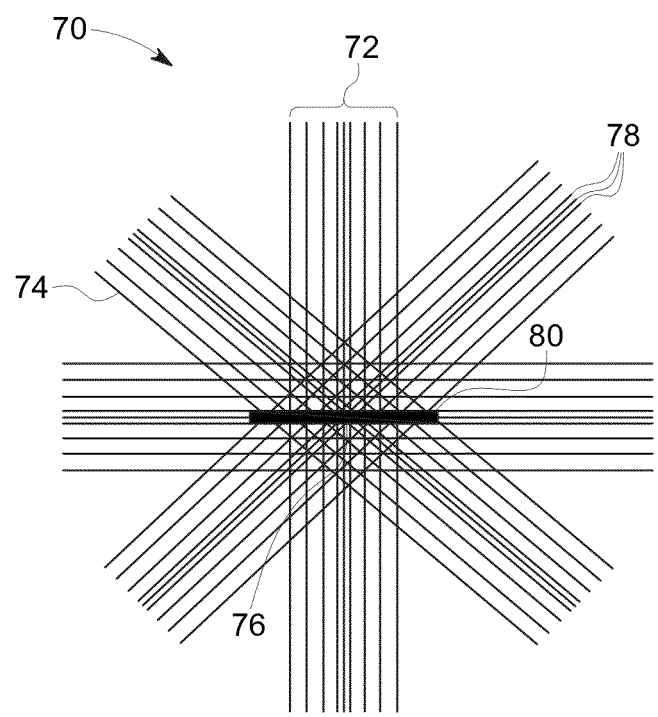
FIG. 10 is an illustration of an embodiment of a sampling pattern formed by acquiring a calibration blade and a plurality of imaging blades in k-space.

As noted above, the present embodiments provide methods for accelerating acquisitions intended to enable motion correction, such as PROPELLER acquisitions. FIG. 2 diagrammatically illustrates one acquisition in accordance with present embodiments, where a series of blades of data in k-space are acquired. A simplified version of FIG. 2 is illustrated in FIG. 10 for clarity. The acquisition may be considered to be an accelerated motion correction sampling trajectory 70, and, in one embodiment, may be an accelerated PROPELLER acquisition. To produce the trajectory 70, imaging blades 72 (e.g., regions of k-space) having encode lines 74 are acquired by filling a pre-defined section of k-space with data to acquire the encode lines 74 of a first imaging blade or region, rotating about a section 76 (e.g., the origin) of k-space in the plane of acquisition, and acquiring subsequent imaging blades or regions 72. Each imaging blade 72 represents a single TR, and the ETL within each TR determines the number of encode lines 74 that are filled within each of the imaging blades 72. As defined herein, an "imaging blade" is intended to denote a region having data that will be transformed to generate an image. Moreover, while certain embodiments refer to the blades as having a rectangular geometry, it should be noted that the regions of k-space that are acquired in a single TR may have any geometry, such as a circular geometry, a triangular geometry, a square geometry, or any combination of geometries. Indeed, such acquisitions are also presently contemplated and are within the scope of the present disclosure. Furthermore, it should be noted that each imaging blade 72 may have the same, similar, or a different geometry when compared to other imaging blades 72.

As illustrated in FIG. 2, the imaging blades 72 are rotated about the section 76, which, due to the overlap between the imaging blades 72, fills a significant portion of k-space in the section 76 as the acquisition is performed. Such filling enables each of the imaging blades 72 to be accelerated to a certain degree. In accordance with present embodiments, the acceleration is performed by acquiring a number of encode lines 74 that is less than a width of each blade. For example, the number of encode lines 74 that are acquired may be represented as a fraction of the width of each blade measured in encode lines. In some embodiments, the number of acquired encode lines 74 may be between about ¼ and ½ of the total width of each the imaging blades 72. For example, in some embodiments, every third line in an imaging blade may be acquired (filled). In certain of these embodiments, the blade may also include internal calibration lines 78 that enable or facilitate synthesis of the missing data in the non-acquired lines of each blade 72 according to parallel imaging reconstruction techniques. The calibration lines 78 may be lines that are oversampled in the field of view (FOV) in either or both of the phase encode and frequency encode directions. Thus, in such embodiments, each imaging blade 72 may include two, three, four, five, or more calibration lines 78. Such embodiments are discussed further below with respect to FIG. 3. However, it should be noted that it may be desirable to eliminate or reduce the number of calibration lines 78 that are acquired to facilitate T1-weighted acquisition and motion correction.

Indeed, while the imaging blades 72 may, in some embodiments, include internal calibration lines 78, it may be desirable to limit the number of internal calibration lines 78 to enable a short echo train length (ETL) for each imaging blade 72 while concomitantly maintaining a blade width sufficient for robust motion correction. For example, for certain T1-weighted acquisitions in which signals are only acquired during certain TE's, it may be desirable to have an ETL of no more than 10, 11, 12, 13, 14, or 15. In embodiments where an acquisition sequence involves T1-weighted FLAIR in which MR signals are acquired at or within a certain inversion time (TI), such relatively short ETLs may be desirable.

In view of the foregoing, it may be appreciated that, for imaging blades 72 having a fixed ETL (e.g., 11) and a relatively fixed blade width sufficient to enable robust motion correction (e.g., 25 or more), the use of more than a few calibration lines 78 within each imaging blade 72 may lead to the other, accelerated portions of the blades 72 being undersampled (i.e., not enough data is acquired), which can produce significant artifacts in a reconstructed image. Accordingly, the present embodiments also include the acquisition of a calibration blade 80, which includes calibration lines 82 (FIG. 3) having fully sampled or oversampled data that enables parallel imaging reconstruction to be performed in an across-blade calibration technique in which calibration data is shared for all of the imaging blades 72. In other words, the calibration blade 80 enables parallel imaging reconstruction of the missing lines within each of the imaging blades 72, which also enables an elimination or reduction in the number of calibration lines 78 acquired during the acquisition of the imaging blades 72. In a similar manner to the imaging blades 72 described above, the calibration blade 80 may have any geometry, such as a circular geometry, a triangular geometry, a square geometry, a polygonal geometry, a curved geometry, or any combination of geometries. Indeed, such acquisitions are also presently contemplated and are within the scope of the present disclosure. Furthermore, the calibration blade 80 need not be the same geometry compared to the imaging blades 72. By way of non-limiting example, one parallel imaging reconstruction method which uses the calibration blade 80 in addition to or in lieu of internal calibration lines 78 may involve an APPEAR technique.

The calibration blade 80, in accordance with present embodiments, may be fully sampled or oversampled in the frequency and/or phase encode directions. By way of non-limiting example, the calibration blade 80 may be oversampled 2× in the frequency encode and 1.5× in the phase encode directions. In addition, while the calibration blade 80 may be acquired at any point during a patient scan, such as before, during, or after the acquisition of the imaging blades 72, in one embodiment, the calibration blade 80 may be acquired as the system 10 is moving toward a steady state. Acquiring the calibration blade 80 in this manner will not affect the overall scan time. Thus, the calibration blade 80 may be acquired in a separate TR from all of the imaging blades 72. Further, while the calibration blade 80 may be acquired in any portion of k-space, in the illustrated embodiment the calibration blade 80 is acquired so as to be centered at the origin of k-space provide enhanced calibration capability.

It should also be noted that the calibration blade 80 may be acquired using the same or different type of acquisition compared to the acquisition of the imaging blades 72. For example, in certain embodiments, the calibration blade 80 may be acquired using a gradient echo (GE) sequence or a variant thereof (e.g., spoiled GE), a spin echo sequence (SE) or a variant thereof (e.g., FSE), or any such acquisition. Indeed, in accordance with an embodiment, the imaging blades 72 may be acquired with an FSE sequence, while the calibration blade 80 may by acquired with a GE sequence or an FSE sequence. The calibration blade 80 acquisition may be performed before, after, or during the acquisition of the imaging blades 72. Moreover, the calibration blade 80 may include any type of data including but not limited to T1-weighted, T1rho-weighted, proton density-weighted, T2-weighted, or T2*-weighted data.

The relative sampling of the imaging and calibration blades 72, 80 may be further appreciated with reference to FIG. 3, which is an expanded view of a section of the sampling trajectory 70. The illustrated imaging blade 72 includes 13 encode lines 74 for which data has been acquired, and 20 lines (see FIGS. 4 and 5) that are missing data. Therefore, the total blade width of the imaging blade 72 illustrated in FIG. 3 is 33. It may be appreciated, based on the illustration of FIG. 3, that the imaging blade 72 has a variable density of sampling. In particular, accelerated regions 84 in the imaging blade 72 bracket three oversampled calibration lines 78. It should be noted, however, that the oversampled calibration lines 78 do not necessarily have to be in the center of the imaging blade 72. Indeed, in certain embodiments, the calibration lines 78 may be disposed in other portions of the imaging blade 72.

As noted above, the internal calibration lines 78 may be used in conjunction with the calibration lines 82 of the calibration blade 80 for parallel imaging reconstruction. It should also be noted that in certain embodiments, not every imaging blade 72 may have calibration lines 78. For example, in some embodiments, none of the imaging blades 72 may include calibration lines 78, while in other embodiments, any one or a combination of the imaging blades 72 may include calibration lines 78 disposed in the same or different sections of the blades.

Figure 4:
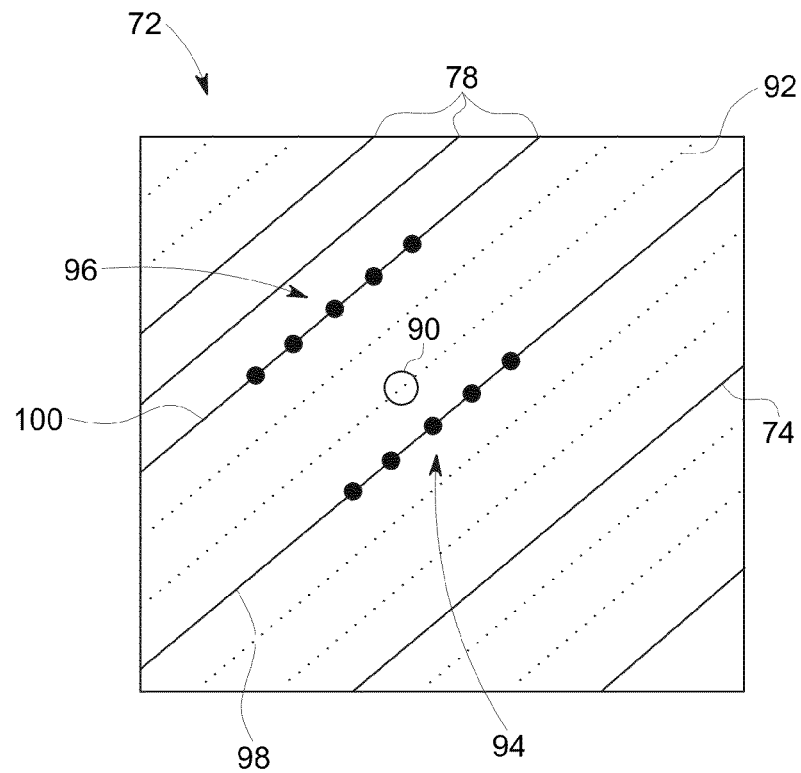
FIG. 4 is an expanded view of an embodiment of an imaging blade having a plurality of acquired lines with sampled data and a plurality of lines that are missing data.
Figure 5:
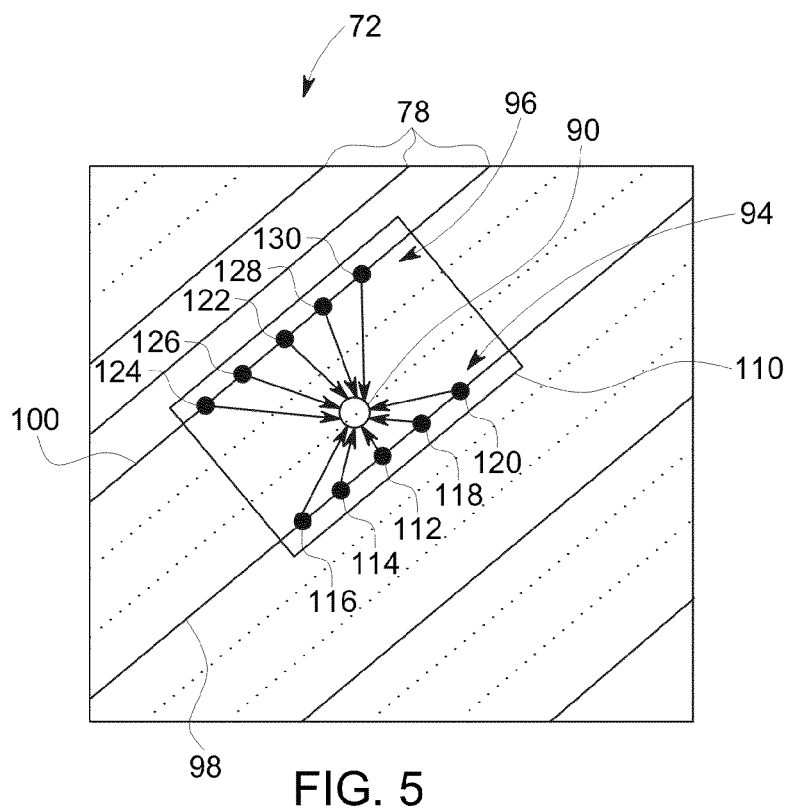
FIG. 5 is a diagrammatic illustration of the imaging blade of FIG. 4 and a pattern formed for the determination of reconstruction weights.
Figure 6:
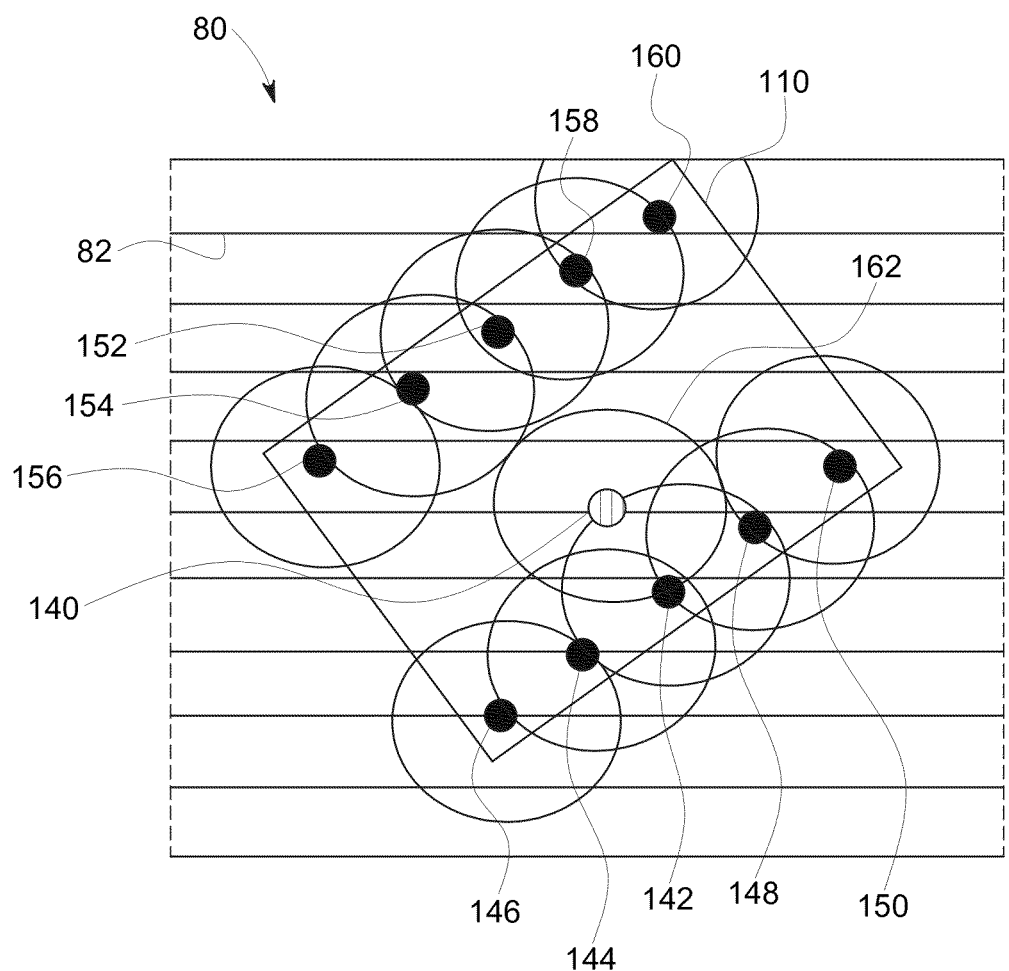
FIG. 6 is diagrammatic illustration of an embodiment of a calibration blade having the pattern determined in FIG. 4 superimposed thereon.

In accordance with present embodiments, as noted above, the data that is missing in the imaging blades 72 may be synthesized using data that is acquired within the imaging blade 72. The data in the imaging blade 72 that is used for such synthesis may include data points from encode lines 74, or data points from the internal calibration lines 78, or a combination thereof. The weights assigned to the data for the synthesis may be produced from the internal calibration lines 78, the calibration lines 82 of the calibration blade 80, or a combination thereof. FIGS. 4-6 illustrate a schema of the manner in which a missing target data point 90 of an unfilled line 92 may be synthesized in accordance with present embodiments.

In particular, FIG. 4 depicts a portion of an embodiment of one of the accelerated imaging blades 72 from the sampling trajectory 70. The imaging blade 72, as noted above, includes a plurality of the encode lines 74, which are sampled and therefore include data points. The imaging blade 72 also includes unfilled lines 92, with one of the lines 92 including the unfilled target data point 90. The illustrated imaging blade 72 also includes internal calibration lines 78.

As illustrated, the unfilled target data point 90 is disposed on one of the unfilled lines 92 that is adjacent to one of the encode lines 74 having first acquired data points 94. Because the imaging blade 72 is accelerated, the unfilled line 92 having the target data point 90 is one line removed from the next line having data, which is one of the internal calibration lines 78 having second data points 96. For simplicity and to facilitate discussion, the encode line 74 having the first data points 94 will be referred to as a first data line 98 and the internal calibration line 78 having the second data points 96 will be referred to as a second data line 100. Indeed, the first and second data lines 98, 100 are not limited to any particular area, lines, or data in the imaging blade 72. Accordingly, the approaches described below for the synthesis of a target data point may involve the use of regularly sampled data, oversampled data, or a combination thereof.

As noted above, the synthesis of the target data point 90 involves the use of both the acquired data in the accelerated imaging blade 72 as well as the calibration data from the calibration blade 80. In accordance with present embodiments and as illustrated in FIG. 5, the synthesis of the target data point 90 includes the identification of a pattern 110 defining a spatial relationship between the target data point 90 and a series of neighboring source data points that are used for the data synthesis. In particular, the pattern 110 includes the first and second data points 94, 96. The first data points 94 include a first source data point 112 having a position on the first data line 98 that is generally the same encode position as the target data point is on its respective encode line 72 (e.g., it is "matched"). The first data points 94 also include first and second trailing source neighbors 114, 116 and first and second leading source neighbors 118, 120. Similarly, the second data points 96 include a second source data point 122, third and fourth trailing source neighbors 124, 126, and third and fourth leading source neighbors 128, 130. It will be appreciated that the pattern 110 may be sufficient for defining the spatial relationship for any target data point, where the pattern 110 may simply be displaced along the imaging blade 72 to define reconstruction data for that particular target data point.

The target data point 90 may be synthesized according to any method. In certain embodiments, the target data point 90 may be interpolated (e.g., linearly) by performing a weighted summation of the source data points 112-130, with the weight given to each source data point being determined using the calibration blade 80, as discussed with respect to FIG. 6. FIG. 6 diagrammatically illustrates an expanded view of the calibration blade 80 having calibration data. In particular, the pattern 110 of FIG. 5 has been superimposed onto the calibration blade 80, with the position of the target data point 90 of FIG. 5 becoming a target calibration point 140 in FIG. 6, trailing and leading source data points 112, 114, 116, 118, and 120, becoming trailing and source calibration points 142, 144, 146, 148, and 150, respectively, and trailing and leading source data points 122, 124, 126, 128, and 130, becoming trailing and source calibration points 152, 154, 156, 158, and 160, respectively. The source calibration points 142-160 are acquired using multiple and unique receive coils.

Specifically, in one embodiment, the pattern 110 may be superimposed on the calibration blade 80 in a manner such that the target calibration point 140 is disposed directly onto an acquired calibration line 82. However, it should be noted that the target calibration point 140 may not necessarily be disposed directly onto one of the calibration lines 82, as is illustrated for several of the source calibration points. For those calibration points, such as points 142, 148, 150, 152, 154, 156, and 158, an interpolation, such as a linear interpolation may be performed based on a nearest-neighbor analysis, may be performed to generate each of their data. An example of the surrounding data that may be used for interpolating each of the points is illustrated as circle 162. The value of the target calibration point 140 may be related to the values and the weights of each of the source calibration points 142-160 acquired using multiple and unique receive coils by the following equation:

$$S*W=T \qquad (1)$$

where S is the value of the calibration data point, W is the weight given to the calibration point, and T is the value of the target calibration point 140. Accordingly, the weight W may be found, if the value of the target calibration point 140 is known (or interpolated), by the value represented by T/S.

To generate accurate weights for each of the source data points in FIG. 5, the pattern 110 may be displaced along the calibration blade 80, where the process of determining the weight for each of the calibration points is repeated a number of times. The repetition may generate an average, mean, mode, or other composite value for each of the calibration points, which are then applied to their respective source data points 112-130 for the synthesis of the target data point 90. Indeed, in some embodiments, the process of determining weights of the source data points 112-130 using the external calibration blade 80 may be performed according to an APPEAR method. For example, in one embodiment, the process for reconstructing target data points in a missing line of an accelerated imaging blade may be performed as described in U.S. Pat. No. 7,619,410 to Beatty et al. entitled "SYSTEM AND METHOD FOR ACCELERATED MAGNETIC RESONANCE PARALLEL IMAGING," filed on Jun. 8, 2007, which is incorporated herein by reference in its entirety for all purposes.

Figure 7:
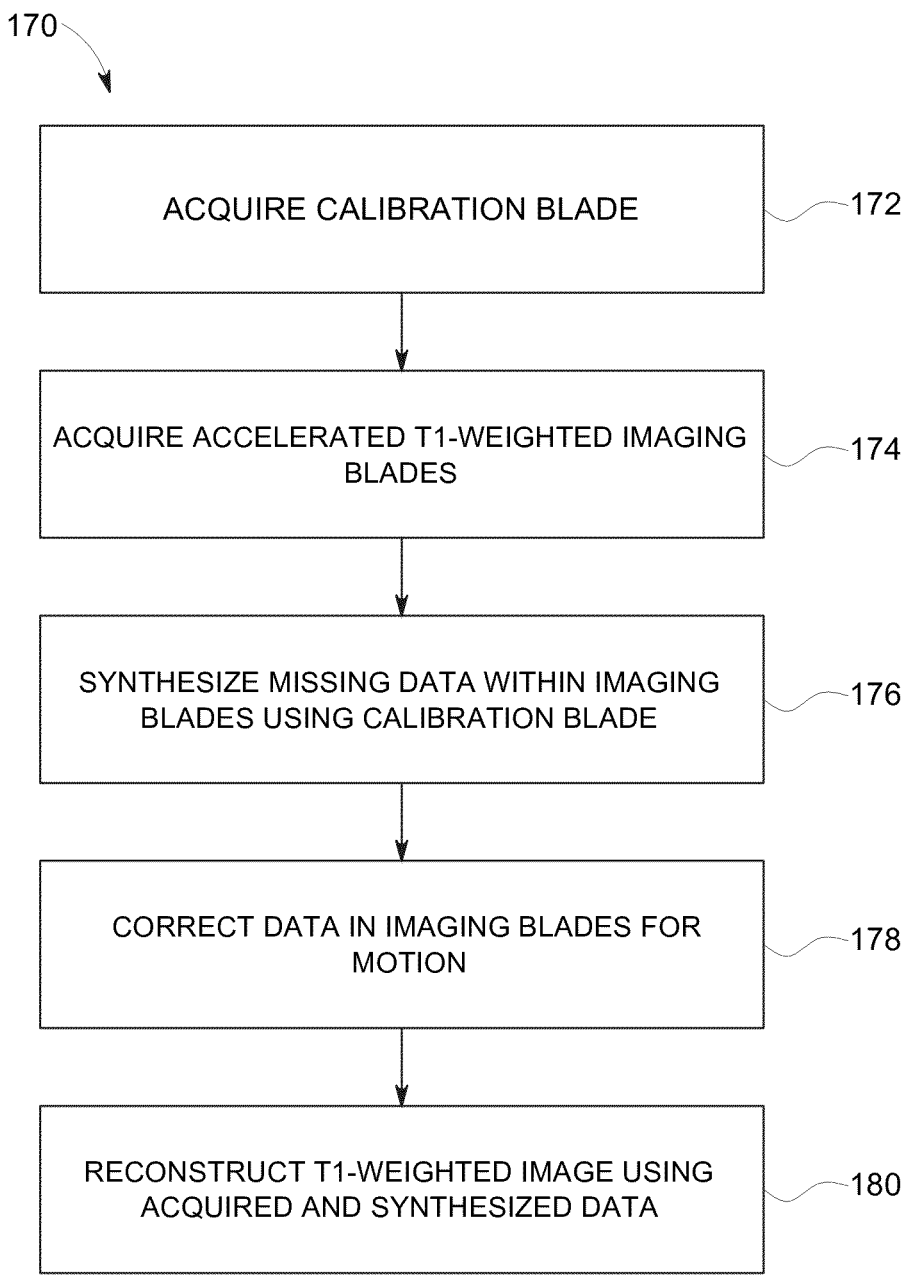
FIG. 7 is a process flow diagram of an embodiment of a method for generating a T1-weighted and motion-corrected image using an accelerated PROPELLER acquisition technique.

Therefore, as noted above, using the external calibration blade 80 and wide, accelerated imaging blades, the present embodiments provide methods for the production of motion-corrected, T1-weighted images. Indeed, in some embodiments, the images may be acquired according to a FLAIR method to attenuate water and/or CSF signal. One such method 170 is illustrated as a process flow diagram in FIG. 7.

In particular, the method 170 is a method for acquiring T1-weighted MR data in an accelerated acquisition, reconstructing the data, and motion-correcting the data to generate a T1-weighted image with motion correction. The method 170 includes acquiring a calibration blade (block 172), such as the calibration blade 80 discussed above. Again, the calibration blade 80 may be acquired in any manner in any section of k-space, and in some embodiments may be acquired across the origin of k-space. In accordance with present embodiments, the calibration blade 80 is fully- or oversampled in the phase encode and/or frequency encode directions to enable enhanced accuracy in reconstruction weight calculation. The region acquired in accordance with block 172 may be a region of k-space having any geometry, such as a rectangular, square, polygonal, curved, circular, or any such geometry that may be acquired using any acquisition method (e.g., GE, SE, FSE).

The method 170 also includes acquiring T1-weighted imaging blades (block 174), such as the accelerated imaging blades 72 discussed above. Generally, the region acquired in accordance with block 174 may be a region of k-space having any geometry, such as a rectangular, square, polygonal, curved, circular, or any such geometry that may be acquired using any acquisition method (e.g., GE, SE, FSE). As discussed above, the imaging blades may each be acquired in a separate TR, with an ETL of between 1 and 15 to enable good T1 contrast and, in some embodiments, good attenuation of fluids according to a FLAIR method. Indeed, in embodiments where block 174 includes a FLAIR acquisition, block 174 may include performing a fast spin echo (FSE) sequence including an inversion pulse (e.g., a 180° inversion pulse) to invert the longitudinal magnetization of a group of gyromagnetic nuclei within the imaged tissue of the patient 14.

After an inversion time (TI), such as a TI where water and/or CSF signal have a substantially null longitudinal magnetization, a tipping pulse (e.g., 90° or less) to tip the longitudinal magnetization of only a portion of the gyromagnetic nuclei (e.g., the protons in brain tissue) to a transverse magnetization. A number of re-phasing pulses may then be performed to collect echoes in the echo train, each of which fills the lines in an accelerated imaging blade. Again, due to the short ETL in T1-weighted FLAIR acquisitions, the length of the ETL may be no longer than 13 in certain embodiments, with each imaging blade having a width of at least 25 to provide robust motion correction capability. Further, the acquisition according to block 174 may have a trajectory such that k-space is filled by overlapping, rotationally displaced imaging blades according to a PROPELLER technique.

Once the accelerated imaging and the external calibration blades are acquired, the missing data in the accelerated imaging blades is synthesized according to the process described above with respect to FIGS. 4-6 (block 176). Generally, the process according to block 176 may involve the determination of reconstruction weights for acquired data points proximate to a target data point using an external calibration blade having calibration data. The target data point may be synthesized using the determined reconstruction weights and the values of the acquired data points. Again, such a process may be performed according to an APPEAR technique. The data synthesis process produces a fully sampled set of imaging blades (i.e., a set of imaging blades that is not missing data).

Using the fully sampled imaging blades, one or more motion correction algorithms are performed to correct the data in the imaging blades for motion (block 178). In certain embodiments, the process according to block 178 may be performed according to a PROPELLER technique. Briefly, such a technique may involve comparing, in the image space, information from each of the imaging blades to determine a relative amount of rotational and translational motion between each of the blades. For example, each imaging blade may be transformed to the image space to produce an image (e.g., a blurry image). The images produced from each of the blades may be compared to determine relative amounts of motion between them. The k-space data in each blade is then corrected based on the relation between the amount of rotation and translation in the images and an expected change in the k-space data of each blade. It should be noted that the present embodiments are not limited to motion correction based on image space determinations. Rather, the determination of rotation and translation based partly or wholly on k-space data is also presently contemplated.

Once the k-space data has been motion-corrected, the data may be reconstructed into a T1-weighed image (block 180). For example, a 2D fast Fourier Transform (FFT) may be performed on the data to produce an image weighted in T1 and having FLAIR contrast.

Figure 8:
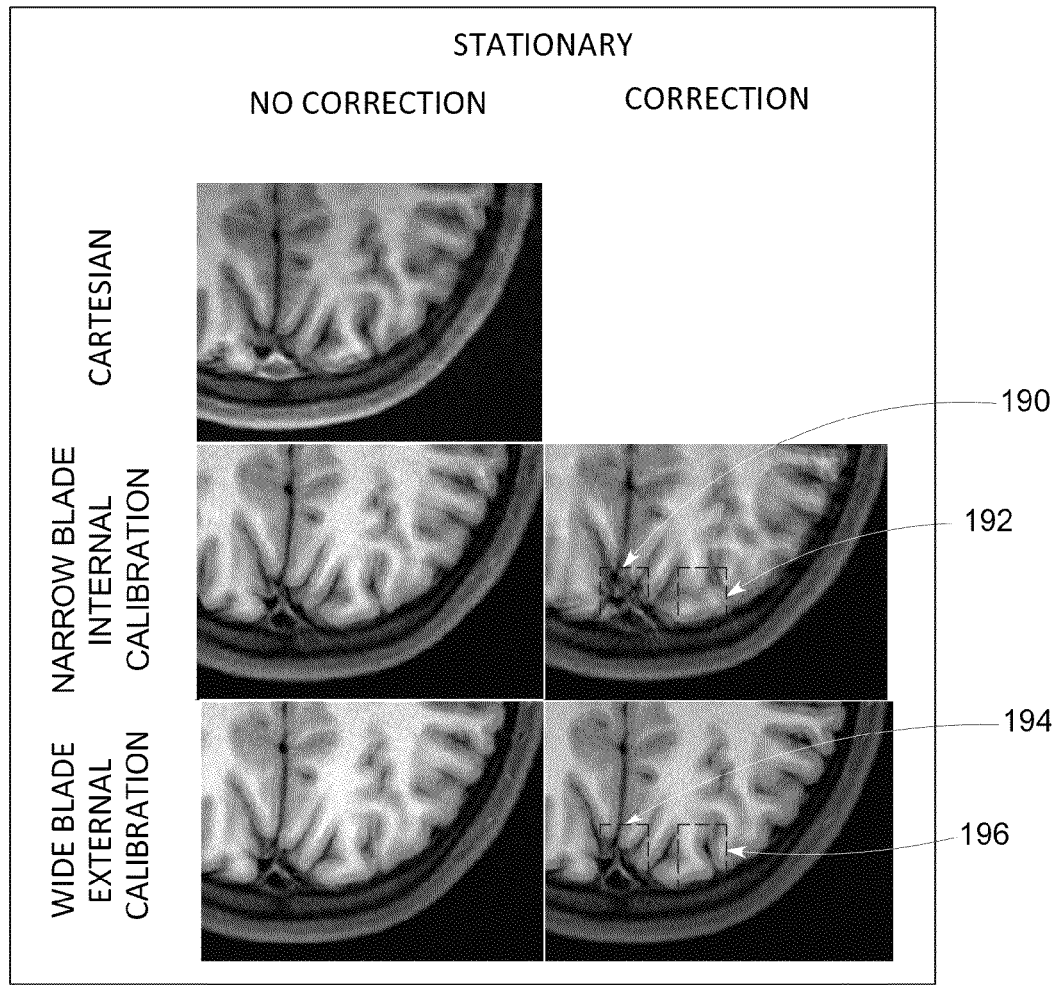
FIG. 8 is an illustration of a comparison between images produced from imaging a stationary patient according to various MR data acquisition methods.
Figure 9:
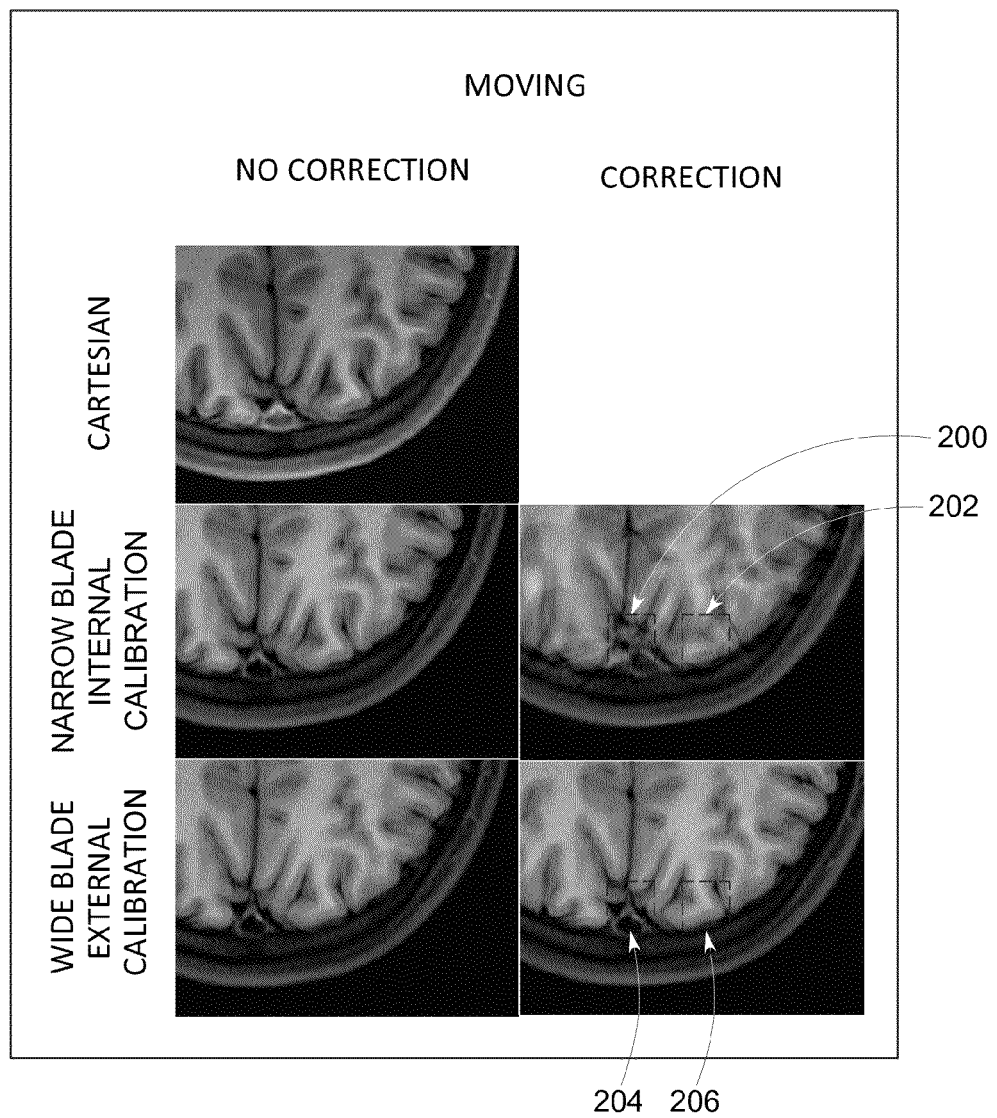
FIG. 9 is an illustration of a comparison between images produced from imaging a moving patient according to various MR data acquisition methods.

FIGS. 8 and 9 illustrate actual examples that provide a qualitative comparison between a Cartesian acquisition, a non-Cartesian acquisition in which internal calibration lines are acquired (having limited blade width), and a non-Cartesian acquisition according to present embodiments having a blade width sufficient for motion correction and using an external calibration blade for parallel imaging reconstruction. The images in FIGS. 8 and 9 were obtained on a 3T MR750 or Signa HDx MRI system available from General Electric Healthcare of Waukesha, Wis. The acquisition parameters included ETL of 11, TE=43.5 ms, TR=3 s, FOV ~24 cm×24 cm, 28×5 mm interleaved slices in 2 acquisitions and BW±50 kHz. Inversion times ranged from 920 ms to 1.2 s to attenuate CSF.

The Cartesian acquisitions were acquired with 384 readout, 0.9 phase field of view (FOV), and 320 phase encodes. No motion correction was performed on the Cartesian image. The narrow blade internal calibration was performed according to the acquisition parameters above, with an internally calibrated PROPELLER acquisition being performed. 4 internal calibration lines were acquired, with the internal calibration lines being used to reconstruct the missing data of the narrow blades to an effective blade width of 13 lines. Accordingly, 47 blades were acquired to maintain full angular sampling. The external calibration acquisition was performed according to the acquisition parameters above, with 45 blades being acquired with undersampling by 3× in the phase encoding direction in a PROPELLER acquisition. These blades included only 2 fully sampled liens in their respective centers.

With 11 echoes per blade, the effective blade width of the external calibration acquisition was 27 lines. A calibration blade was also acquired, which was oversampled by 2× in the frequency encode direction and 1.5× in the phase encode direction. Calibration coefficients were calculated using data interpolated from the calibration blade onto the undersampled imaging blade using the APPEAR algorithm.

In the images of FIG. 8, the patient being imaged was instructed to remain still, and each of the acquisitions were performed. As shown, the narrow blade internal calibration, absent motion and motion correction, produced an image similar to the wide blade external calibration techniques according to present embodiments. However, once the PROPELLER motion correction algorithm was performed, significant blurring and artifacts were produced in the narrow blade acquisition, as highlighted in regions 190 and 192. In contrast, the wide blade external calibration acquisition produced an image comparable to the non-corrected image and qualitatively superior to the narrow blade acquisition, as highlighted by corresponding regions 194 and 196.

In the images of FIG. 9, the patient being imaged was instructed to move, and each of the acquisitions were performed. As shown, the Cartesian acquisition produced a relatively blurry image compared to the image produced in the stationary acquisition. Similarly, the narrow blade internal calibration, absent motion and motion correction, produced a blurry image. However, upon performing the PROPELLER motion correction algorithm, significant image degradation was qualitatively observed, as highlighted by regions 200 and 202.

The wide blade external calibration techniques according to present embodiments also produced a blurry image compared to the stationary acquisition prior to motion correction. However, once the PROPELLER motion correction algorithm was performed, the wide blade external calibration acquisition produced an image qualitatively superior to the narrow blade acquisition, as highlighted by corresponding regions 204 and 206. Accordingly, present embodiments in which wide blades (e.g., greater than 25 lines) are acquired along with an external calibration blade may provide superior motion correction and T1-weighted images compared to blades having narrower widths (e.g., less than 25 lines) and internal calibration (e.g., 4 fully sampled internal calibration lines).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnetic resonance imaging method comprising:
using a magnetic resonance system comprising a primary field magnet, a plurality of gradient field coils, a radiofrequency (RF) transmit coil, a plurality of RF receiving coils, and control circuitry to perform magnetic resonance imaging steps comprising:
acquiring a region of k-space calibration data using the primary field magnet, the plurality of gradient field coils, the RF transmit coil, the plurality of RF receiving coils, and the control circuitry;
acquiring a set of T1-weighted k-space imaging data representative of a subject of interest using the primary field magnet, the plurality of gradient field coils, the RF transmit coil, the plurality of RF receiving coils, and the control circuitry, the set of T1-weighted k-space imaging data comprising regions of undersampled k-space data rotated about a section of k-space, wherein each region of undersampled k-space data comprises filled encode lines that have acquired data and unfilled encode lines that are missing data, wherein the regions of undersampled k-space data comprise blades that have a rectangular geometry and an effective width that is between 27 and 33 encode lines, and wherein acquiring the set of T1-weighted k-space imaging data comprises:
performing a fluid attenuating inversion pulse to attenuate cerebrospinal fluid (CSF) or water in the subject of interest; and
receiving magnetic resonance (MR) signals from the subject of interest following the fluid attenuating inversion pulse, wherein the MR signals that are received from an echo train within each repetition time (TR) of the acquisition of the set of T1-weighted k-space data acquires the data of the filled lines within each region of undersampled k-space data, and wherein an echo train length of each TR is between 10 and 15;
generating, via the control circuitry, a set of reconstruction weights for the regions of undersampled k-space data using the region of k-space calibration data;
synthesizing, via the control circuitry, k-space data for at least a portion of the second data points using the set of reconstruction weights; and
generating, via the control circuitry, a T1-weighted image of the subject of interest using the T1-weighted k-space imaging data and the synthesized k-space data.

2. The method of claim 1, wherein the region of k-space calibration data is acquired before acquiring any of the set of T1-weighted k-space imaging data.

3. The method of claim 1, comprising correcting the T1-weighted k-space data for motion according to a Periodically Rotated Overlapping Parallel Lines with Enhanced Reconstruction (PROPELLER) technique.

4. The method of claim 1, wherein the regions of undersampled k-space data each comprise a pair of calibration lines comprising calibration data.

5. The method of claim 1, wherein acquiring the region of k-space calibration data comprises oversampling the k-space calibration data in the frequency and phase encoding directions.

6. A magnetic resonance imaging (MRI) system, comprising:
a primary field magnet configured to place gyromagnetic nuclei within a patient into an equilibrium magnetization;
a plurality of gradient field coils configured to encode positional information into the gyromagnetic nuclei;
a radiofrequency (RF) transmit coil configured to perturb the gyromagnetic nuclei away from their equilibrium magnetization, wherein the RF transmit coil is configured to perform a fluid attenuating inversion pulse to attenuate cerebrospinal fluid (CSF) or water in the patient;
a plurality of RF receiving coils configured to receive MR signals from the gyromagnetic nuclei as they relax to their equilibrium magnetization following the fluid attenuating inversion pulse; and control circuitry coupled to the gradient field coils, to the RF transmit coil, and to the plurality of RF receiving coils, wherein the control circuitry is configured to apply control signals to the gradient field coils, the RF transmit coil and the plurality of RF receiving coils to:

acquire undersampled imaging blades having undersampled T1-weighted k-space data, wherein each undersampled imaging blade is rotated about a section of k-space relative to every other undersampled imaging blade, and each undersampled imaging blade comprises first encode lines that have acquired data and second encode lines in which no data are acquired, and wherein a width of each undersampled imaging blade is at least 27 encode lines, and wherein each undersampled imaging blade is acquired in a repetition time (TR) and an echo train length (ETL) of each TR is between 10 and 15; and acquire a calibration blade of fully-sampled or oversampled k-space data separately from the imaging blades.

7. The system of claim 6, comprising image reconstruction hardware configured to generate a set of reconstruction weights for the second encode lines of the undersampled imaging blades using the calibration blade according to an anti-aliasing partially parallel encoded acquisition reconstruction (APPEAR) algorithm, and wherein the imaging blades, the calibration blade, or a combination thereof, comprise a rectangular geometry.

8. The system of claim 7, wherein each of the undersampled imaging blades comprises between 1 and 3 oversampled encode lines that are used in conjunction with the calibration blade to generate reconstruction weights for the second lines according to the APPEAR algorithm.

9. The system of claim 7, wherein the image reconstruction hardware is configured to synthesize k-space data for the second encode lines using the set of reconstruction weights to generate fully sampled imaging blades.

10. The system of claim 9, wherein the image reconstruction hardware is configured to correct the fully sampled imaging blades, or image data generated from the fully sampled imaging blades, for motion according to a periodically rotated overlapping parallel lines with enhanced reconstruction (PROPELLER) algorithm to generate a motion-corrected T1-weighted image.

11. The system of claim 6, wherein the calibration blade comprises T1-weighted data, T1 rho-weighted data, proton density-weighted data, T2-weighted data, or T2*-weighted data.

12. One or more tangible, non-transitory, machine-readable media storing instructions executable by one or more processors to:

cause a magnetic resonance (MR) imaging system to acquire undersampled imaging blades having undersampled T1-weighted k-space data, wherein each undersampled imaging blade is rotated about a section of k-space relative to every other undersampled imaging blade, and each undersampled imaging blade comprises first encode lines that have acquired data and second encode lines in which no data are acquired, wherein the undersampled imaging blades are filled using an accelerated T1 fluid attenuated inversion recovery (FLAIR) acquisition sequence, wherein a width of each undersampled imaging blade is at least 27 encode lines, and wherein each undersampled imaging blade is acquired in a repetition time (TR) and an echo train length (ETL) of each TR is between 10 and 15;

cause the MR imaging system to acquire a calibration blade of fully-sampled or oversampled k-space data separately from the undersampled imaging blades;

generate a set of reconstruction weights for the second encode lines of the undersampled imaging blades using the calibration blade according to an anti-aliasing partially parallel encoded acquisition reconstruction (APPEAR) algorithm;

synthesize k-space data for the second encode lines using the set of reconstruction weights to generate fully sampled imaging blades; and correct the fully sampled imaging blades, or image data generated from the fully sampled imaging blades, for motion according to a periodically rotated overlapping parallel lines with enhanced reconstruction (PROPELLER) algorithm to generate a motion-corrected T1-weighted image.

* * * * *